(12) United States Patent
Akiyama et al.

(10) Patent No.: US 8,263,478 B2
(45) Date of Patent: Sep. 11, 2012

(54) METHOD FOR MANUFACTURING SEMICONDUCTOR SUBSTRATE

(75) Inventors: Shoji Akiyama, Gunma (JP); Yoshihiro Kubota, Gunma (JP); Atsuo Ito, Gunma (JP); Koichi Tanaka, Gunma (JP); Makoto Kawai, Gunma (JP); Yuuji Tobisaka, Gunma (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 0 days.

(21) Appl. No.: 12/805,582

(22) Filed: Aug. 6, 2010

(65) Prior Publication Data

US 2010/0311221 A1     Dec. 9, 2010

Related U.S. Application Data

(62) Division of application No. 11/979,446, filed on Nov. 2, 2007, now abandoned.

(30) Foreign Application Priority Data

Nov. 10, 2006 (JP) ................. 2006-305657

(51) Int. Cl.
H01L 21/30 (2006.01)
H01L 21/46 (2006.01)
(52) U.S. Cl. ................. 438/458; 438/455; 257/E21.568
(58) Field of Classification Search ......... 438/455, 438/458, 459; 257/E21.568
See application file for complete search history.

(56) References Cited

U.S. PATENT DOCUMENTS

| | | | | |
|---|---|---|---|---|
| 5,783,022 A | * | 7/1998 | Cha et al. ................. | 156/701 |
| 6,571,486 B1 | * | 6/2003 | Tondorf et al. ............ | 33/706 |
| 6,632,724 B2 | * | 10/2003 | Henley et al. ............. | 438/455 |
| 2003/0170990 A1 | | 9/2003 | Sakaguchi et al. | |
| 2006/0121691 A1 | | 6/2006 | Noguchi et al. | |

(Continued)

FOREIGN PATENT DOCUMENTS

EP    0 961 312 A2    12/1999

(Continued)

OTHER PUBLICATIONS

Nov. 9, 2011 Office Action issued in Chinese patent application No. 200710186310.7 (with translation).
Aug. 29, 2011 extended European search report issued in European Patent Application No. 07021589.2.
Auberton-Herve et al., "Smart Cut Technology: Industrial Status of SOI Wafer Production and New Material Developments", *Electrochemical Society Proceedings*, vol. 99, No. 3, pp. 93-106 (1999).

(Continued)

*Primary Examiner* — Chuong A Luu
*Assistant Examiner* — Nga Doan
(74) *Attorney, Agent, or Firm* — Oliff & Berridge, PLC

(57) ABSTRACT

Hydrogen ions are implanted to a surface (main surface) of the single crystal Si substrate 10 at a dosage of $1.5 \times 10^{17}$ atoms/cm$^2$ or higher to form the hydrogen ion implanted layer (ion-implanted damage layer) 11. As a result of the hydrogen ion implantation, the hydrogen ion implanted boundary 12 is formed. The single crystal Si substrate 10 and the low melting glass substrate 20 are bonded together. The bonded substrate is heated at relatively low temperature, 120° C. or higher and 250° C. or lower (below a melting point of the support substrate). Further, an external shock is applied to delaminate the Si crystal film along the hydrogen ion implanted boundary 12 of the single crystal Si substrate 10 out of the heat-treated bonded substrate. Then, the surface of the resultant silicon thin film 13 is polished to remove a damaged portion, so that a semiconductor substrate can be fabricated. There can be provided a semiconductor substrate in which a high-quality silicon thin film is transferred onto a substrate made of a low melting point material.

2 Claims, 2 Drawing Sheets

U.S. PATENT DOCUMENTS

| | | | |
|---|---|---|---|
| 2006/0205180 A1 | 9/2006 | Henley et al. | |
| 2006/0240275 A1 | 10/2006 | Gadkaree | |
| 2007/0212852 A1 | 9/2007 | Tauzin et al. | |

FOREIGN PATENT DOCUMENTS

| | | | | |
|---|---|---|---|---|
| JP | 04089492 | * | 3/1992 | 549/214 |
| JP | B2 3048201 | | 6/2000 | |

OTHER PUBLICATIONS

Chinese Office Action for Chinese Application No. 200710186310.7; mailed Mar. 11, 2010.

Jun. 5, 2012 Office Action issued in Chinese Patent Application No. 200710186310.7 (with partial translation).

\* cited by examiner

FIG.2
(A) 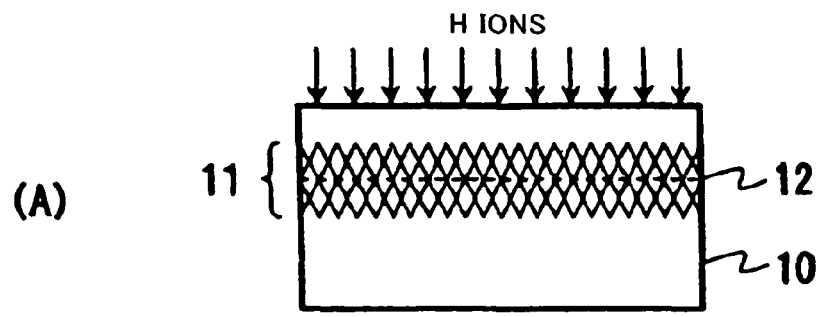
(B) 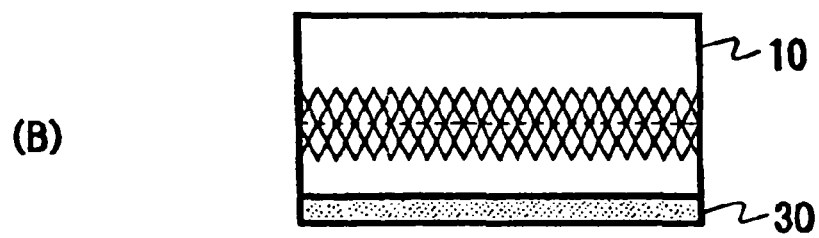
(C) 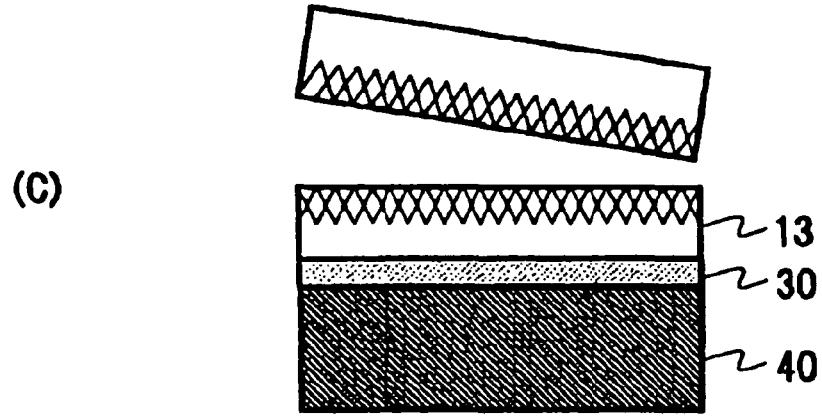
(D) 

METHOD FOR MANUFACTURING SEMICONDUCTOR SUBSTRATE

This is a Division of application Ser. No. 11/979,446, filed Nov. 2, 2007, which claims priority to Japanese Application No. 2006-305657, filed Nov. 10, 2006. The disclosure of the prior applications is hereby incorporated by reference herein in their entirety.

BACKGROUND

1. Field of the Invention

The present invention relates to a method for manufacturing a semiconductor substrate where a silicon thin film is formed on a substrate made of a low melting point material.

2. Description of the Related Art

A technique of forming (transferring) a silicon thin film, especially, a single crystal silicon thin film onto a substrate made of another material has been known as a so-called "bonding technique". This technique has recently received attentions on account of being applicable to "flexible device" that can be applied even to a curved surface if a silicon thin film is formed on a low melting point organic thin film (film), for example. In addition, a technique of combining a single crystal silicon thin film onto a substrate made of a low melting point material (for example, low melting glass or the like) is one of the promising techniques because of a lower material cost than a cost for quartz glass or the like.

Hitherto, a SmartCut method (SOITEC method) has been known as a method for manufacturing a semiconductor substrate through a bonding process. In particular, the SmartCut method is a method for bonding a silicon substrate prepared by implanting hydrogen ions to a bonding surface side to generate "air bubbles" called "hydrogen blisters" at high density to a support substrate and then performing heat treatment at relatively high temperature, 500° C. or higher to cause "growth" of the "hydrogen blister" to thermally delaminate the silicon thin film based on the "bubble growth" to thereby manufacture a semiconductor substrate (for example, Japanese Patent No. 3048201 or A. J. Auberton-Herve et al., "SMART CUT TECHNOLOGY: INDUSTRIAL STATUS of SOI WAFER PRODUCTION and NEW MATERIAL DEVELOPMENTS" (Electrochemical Society Proceedings Volume 99-3 (1999) p. 93-106)).

SUMMARY

In general, however, it is very difficult to combine the single crystal silicon thin film (the single crystal silicon thin film may be formed into a device) onto another substrate made of the low melting point material. This is because conventional methods such as the SmartCut method require a high-temperature process for transferring the silicon thin film (500° C. or higher), and the low melting point material is melted in this temperature region. In order to transfer a silicon thin film onto a support substrate made of an organic material film or a low melting point material such as low melting glass, it is necessary to reduce a peak temperature during a transferring process down to about 250° C. not to melt the support substrate.

The present invention has been accomplished in view of the above problems. It is accordingly an object of the present invention to provide a technique capable of manufacturing a semiconductor substrate such as an SOI substrate or a flexible-device substrate where a high-quality silicon thin film is formed on low melting point materials such as plastics or low melting glass at low costs in a simple manner.

To solve the above problems, the present invention provides a method for manufacturing a semiconductor substrate, including: a first step of implanting hydrogen ions to a main surface side of a silicon substrate at a dosage of $1.5 \times 10^{17}$ atoms/cm$^2$ or higher; a second step of bonding a main surface of the silicon substrate to a main surface of a support substrate made of a low melting point material; a third step of performing heat treatment on the bonded substrate at a temperature of 120° C. or higher and 250° C. or lower below a melting point of the support substrate; and a fourth step of delaminating a silicon crystal film along a hydrogen ion implanted boundary of the silicon substrate out of the bonded substrate after the heat treatment to form a silicon thin film on a surface of the support substrate.

If the support substrate is made of an inorganic material, it is preferred that the second step of bonding the substrates be carried out by applying surface activation through plasma treatment or ozone treatment to at least one of the main surface of the silicon substrate and the main surface of the support substrate. The support substrate is, for example, low melting glass having a melting point of 500° C. or lower.

Further, if the support substrate is made of an organic material, it is preferred that the second step of bonding the substrates be carried out by applying an adhesive to the main surface of the silicon substrate and the main surface of the support substrate. The support substrate is made of, for example, plastics.

If the substrates are bonded by means of the adhesive, the adhesive is preferably silicon oil.

The fourth step is carried out, for example, by applying a mechanical shock onto a hydrogen ion implanted region at an edge of the silicon substrate.

According to the present invention, a hydrogen ion implantation amount and heat treatment temperature are optimized to thereby enable delamination of a silicon thin film through a low-temperature process at 250° C. or lower, so a high-quality silicon thin film can be transferred even onto a substrate made of a low melting point material, and an inexpensive SOI substrate can be provided as compared with an SOI substrate prepared by transferring a silicon thin film onto quartz glass.

Further, a flexible substrate such as a plastic film is used as the low melting point substrate, so a flexible-device substrate can be also provided.

BRIEF DESCRIPTION OF THE DRAWINGS

FIG. 2 is an explanatory view of a second example of a manufacturing process of a semiconductor substrate according to the present invention.

DETAILED DESCRIPTION OF EMBODIMENTS

Figure 1:
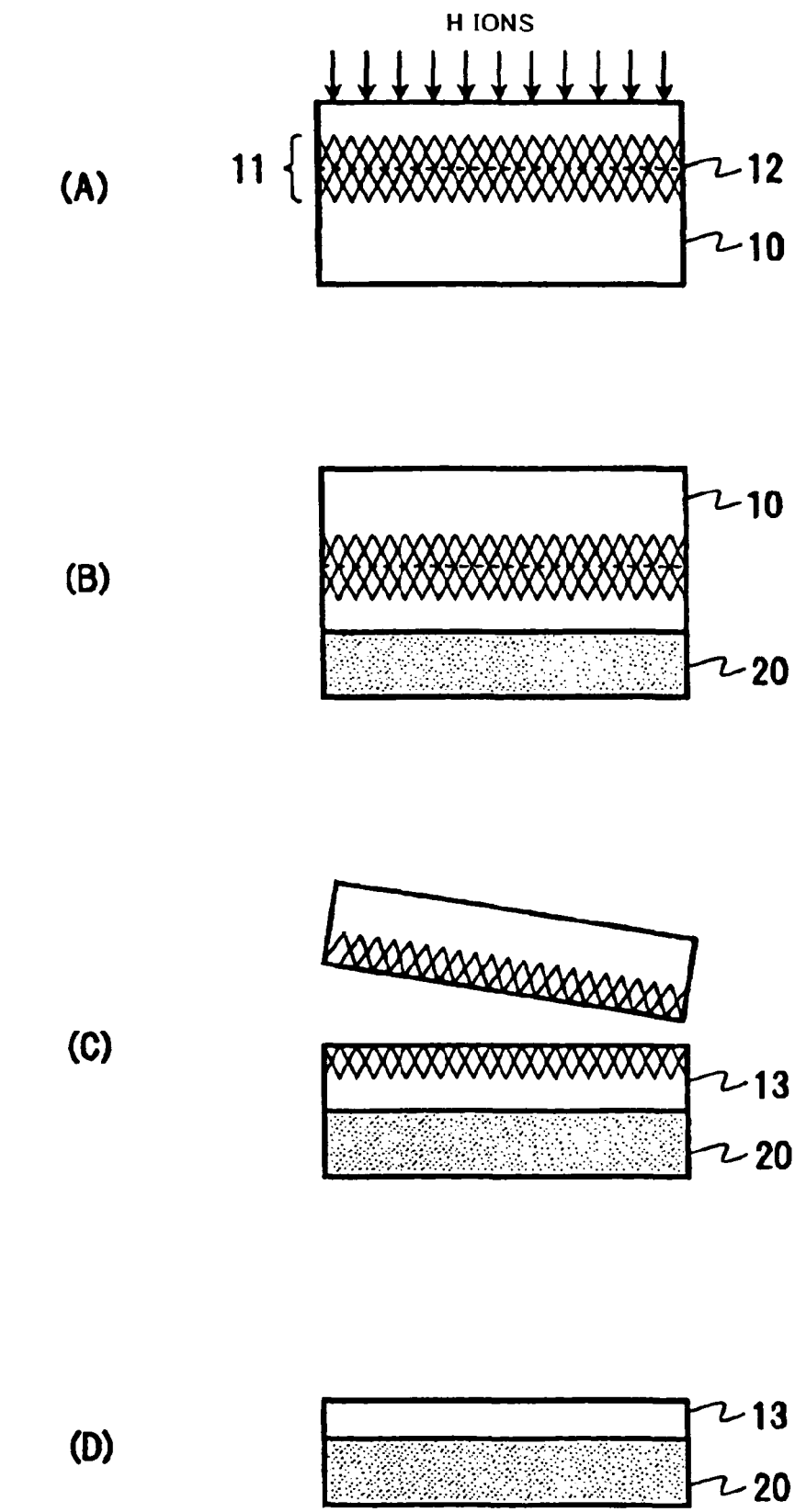
FIG. 1 is an explanatory view of a first example of a manufacturing process of a semiconductor substrate according to the present invention.

Hereinafter, an embodiment of the present invention will be described on the basis of examples.

Example 1

In this example, low melting glass is used as an inorganic material substrate made of a low melting point material. Here, the term "low melting point material" means a material having a melting point of about 500° C. or lower.

FIG. 1 illustrate a process example of a method for manufacturing a semiconductor substrate of this embodiment. A silicon substrate 10 of FIG. 1(A) is a single crystal Si substrate. In this example, the single crystal Si substrate 10 is a commercially available Si substrate grown by a Czochralski method (CZ method), for example. Its electric characteristic value such as a conductivity type or a specific resistance, or crystal orientation or crystal diameter is appropriately determined depending on a design value or process of a device using a semiconductor substrate manufactured by the method of the present invention or a display area of a manufactured device. Further, an oxide film may be formed in advance on a surface (bonding surface) of the single crystal Si substrate 10.

First, hydrogen ions are implanted to a surface (main surface) of the single crystal Si substrate 10 to form a hydrogen ion implanted layer (ion-implanted damage layer) 11. As a result of the hydrogen ion implantation, a "hydrogen ion implanted boundary" 12 is formed at a predetermined depth (average ion implantation depth L) near the surface of the single crystal Si substrate 10, and a localized "micro bubble layer" is formed in the region (FIG. 1(A)). The hydrogen ion implanted boundary 12 serves as a "junction surface" (bonding surface) later.

According to the present invention, a hydrogen ion implantation amount (dosage) is set higher than a value used in the SmartCut method that is a conventional method. The dosage is set to $1.5 \times 10^{17}$ atoms/cm$^2$ or higher. The dosage is determined for the purpose of increasing a concentration of implanted hydrogen ions near a bonding boundary (delamination boundary) to delaminate a silicon thin film through a low-temperature process.

Incidentally, it has been known that, if a semiconductor substrate is fabricated with the SmartCut method under such conditions that a dosage of hydrogen ions exceeds $1 \times 10^{17}$ atoms/cm$^2$, an SOI layer formed in a subsequent step involves surface roughness. Thus, the dosage is generally set to about $7 \times 10^{16}$ atoms/cm$^2$.

However, the present inventors have made extensive studies and revealed that surface roughness of the SOI layer that would occur under the above ion implantation conditions of the conventional method is caused by a heat treatment process carried out at relative high temperature (for example, 500° C.) for delaminating a silicon thin film and forming an SOI layer, not by the hydrogen ion dosage itself.

As described above, in the case of fabricating an SOI substrate with the SmartCut method, hydrogen ions are implanted to a bonding surface side of a silicon substrate to generate "air bubbles" called "hydrogen blisters" at high density to thermally delaminate the silicon thin film based on "bubble growth" of the "hydrogen blisters", which proceeds through heat treatment at relatively high temperature. Here, the "bubble growth" is a diffusion phenomenon of hydrogen atoms. Therefore, in a process that "bubbles" "grow" at extremely high density under high dosage conditions, hydrogen atoms diffuse remarkably. The atomic diffusion phenomenon would cause surface roughness of the SOI layer.

Therefore, if the silicon thin film can be delaminated at low temperature, diffusion of hydrogen atoms in the delamination process is considerably suppressed. Therefore, even if hydrogen ions are implanted with a high dosage, surface roughness of the delaminated silicon film never occurs.

The present inventors have executed implantation of hydrogen ions with varying dosages and examined an influence of the implantation on surface roughness of the delaminated silicon film under the above assumption. The examination result shows that surface roughness does not occur with a dosage of $4 \times 10^{17}$ atoms/cm$^2$ or less as long as a low-temperature delamination process is performed as described below.

A depth of the ion implanted layer 11 from the single crystal Si substrate 10 (average ion implantation depth L) is controlled in accordance with an acceleration voltage of implanted ions and is determined depending on a thickness of a silicon film to be delaminated. For example, the average ion implantation depth L is set to 0.5 μm or less, and the acceleration voltage is set to 50 to 100 keV. Incidentally, as is generally carried out to suppress channeling of implanted ions in a process of implanting ions into Si crystal, an insulator film such as an oxide film may be formed beforehand on an ion implantation surface of the single crystal Si substrate 10 to implant ions through the insulator film.

The single crystal Si substrate 10 including an ion-implanted damage layer 11 that is formed by implanting hydrogen ions is bonded to a low melting glass substrate 20 (FIG. 1(B)). Incidentally, these substrates have substantially the same diameter. It is advantageous to form orientation flat (OF) also in the low melting glass substrate 20 similar to OF formed in the single crystal Si substrate 10 and bond the substrates together while aligning the OFs with an aim to facilitate a subsequent device manufacturing process.

The bonding may be performed by means of an adhesive such as silicon oil. In this example, the bonding is performed by subjecting bonding surfaces of both of the single crystal Si substrate 10 and the low melting glass substrate 20 to plasma treatment or ozone treatment for cleaning or activating the surface. This surface treatment is carried out for the purpose of removing an organic material from the surface as the bonding surface or increasing OH groups on the surface to activate the surface, and the treatment is not necessarily performed on both of the bonding surfaces of the single crystal Si substrate 10 and the low melting glass substrate 20 but may be performed on one of the bonding surfaces.

In the case of performing the surface treatment through plasma treatment, a single crystal Si substrate and/or a low melting glass substrate with the surface being cleaned by RCA cleaning is placed on a sample stage in a vacuum chamber, and a plasma gas is introduced to the vacuum chamber up to a predetermined vacuum degree. Incidentally, examples of the usable plasma gas include an oxygen gas, a hydrogen gas, an argon gas, or a mixed gas thereof, which is used for surface treatment of a single crystal Si substrate, or a mixed gas of a hydrogen gas and a helium gas. An appropriate gas may be selected in accordance with a surface condition of the single crystal Si substrate or its application.

Further, if the surface treatment aims at oxidizing the single crystal Si surface, a gas containing at least an oxygen gas is used as the plasma gas. Incidentally, since the low melting glass substrate surface is oxidized, there is not particular limitation on selection of a plasma gas as in the above case. After the introduction of the plasma gas, a radio-frequency plasma having a power of about 100 W is generated and then applied to the surface of the single crystal Si substrate and/or the low melting glass substrate as a plasma treatment target for about 5 to 10 seconds, and the treatment is completed.

In the case of performing the surface treatment through ozone treatment, a single crystal Si substrate and/or a low melting glass substrate with the surface being cleaned by RCA cleaning is placed on a sample stage in a chamber kept in an atmosphere containing an oxygen, and plasma gas such as a nitrogen gas or an argon gas is introduced into the chamber, after which a radio-frequency plasma having a predetermined power is generated, and the oxygen in the atmosphere is turned into an ozone by the plasma to apply the treatment to the surface of the target single crystal Si substrate and/or low melting glass substrate for a predetermined period.

If the surfaces of the surface-treated single crystal Si substrate 10 and the low melting glass substrate 20 as bonding surfaces are closely bonded, the surface (bonding surface) of at least one of the two substrates is applied with surface treatment through the plasma treatment or ozone treatment and thus activated, so a bonding strength, which is high enough to withstand mechanical delamination or polishing in a subsequent step even in a closely-attached (bonded) state at room temperature, can be obtained.

Subsequently, the bonded substrate is heated at relatively low temperature, 120° C. or higher and 250° C. or lower (below a melting point of the support substrate). The upper limit of the process temperature is set to 250° C. not to melt the support substrate, and the lower limit thereof is set to 120° C. because dissociation of Si—Si bonds cannot proceed well in accordance with aggregation of implanted hydrogen ions, and the mechanical strength of the ion implanted boundary 12 is not reduced enough.

Subsequently, an external shock is applied to delaminate a Si crystal film along a hydrogen ion implanted boundary 12 of the single crystal Si substrate 10 out of the heat-treated bonded substrate (FIG. 1(C)). The heat treatment aims at weakening chemical bonds of Si atoms in the ion-implanted damage layer 11 to lower the mechanical strength. Then, the surface of the resultant silicon thin film 13 is polished to remove a damaged portion, so that a semiconductor substrate can be fabricated (FIG. 1(D)).

Here, there are various techniques for externally applying a shock to delaminate the silicon thin film. For example, a mechanical shock is applied onto a hydrogen ion implanted region (near the hydrogen ion implanted boundary) at an edge of the single crystal Si substrate. The chemical bonds of Si atoms in the ion-implanted damage layer 11 are already weakened through the heat treatment at 120 to 250° C. Hence, if any technique is employed, a shock level is much lower than that in a conventional method. Therefore, a damage involved in mechanical delamination of the silicon thin film is avoided.

Example 2

In this example, as an organic material substrate made of a low melting point material, a thinner plastic substrate (flexible substrate) is used.

FIG. 2 illustrate a process example of a method for manufacturing a semiconductor substrate of this embodiment. Hydrogen ions are implanted to the silicon substrate 10 (single crystal silicon substrate) of FIG. 2(A) similarly to Example 1.

The single crystal Si substrate 10 including the ion-implanted damage layer 11 formed by implanting hydrogen ions in this way is bonded to the plastic substrate 30 (FIG. 2(B)). Incidentally, in this example, the bonding is carried out by applying an adhesive to bonding surfaces of the single crystal Si substrate 10 and the plastic substrate 30. Incidentally, these substrates have substantially the same diameter. It is advantageous to form orientation flat (OF) also in the plastic substrate 30 similar to OF formed in the single crystal Si substrate 10 and bond the substrates together while aligning the OFs with an aim to facilitate a subsequent device manufacturing process.

Subsequently, the bonded substrate is heated at relatively low temperature, 120° C. or higher and 250° C. or lower (below a melting point of the support substrate). Further, an external shock is applied to delaminate a Si crystal film along the hydrogen ion implanted boundary 12 of the single crystal Si substrate 10 out of the heat-treated bonded substrate (FIG. 2(C)). Then, the surface of the resultant silicon thin film 13 is polished to remove a damaged portion, so that the semiconductor substrate can be fabricated (FIG. 2(D)).

Incidentally, reference numeral 40 of FIG. 2(C) denotes a vacuum chuck stage that is used for preventing the plastic substrate 30 from being bent upon the delamination.

According to the present invention, a silicon thin film can be transferred onto the low melting point substrate. As a result, an inexpensive SOI substrate or a flexible-device substrate can be provided.

What is claimed is:

1. A method for manufacturing a semiconductor substrate, comprising:
   a first step of implanting hydrogen ions to a main surface side of a silicon substrate at a dosage of $1.5 \times 10^{17}$ atoms/cm$^2$ or higher;
   a second step of bonding a main surface of the silicon substrate and a main surface of a support substrate made of a low melting point material;
   a third step of performing heat treatment on the bonded substrate at a temperature of 120° C. or higher and 250° C. or lower and below a melting point of the support substrate;
   a fourth step of delaminating a silicon crystal film along a hydrogen ion implanted boundary of the silicon substrate out of the bonded substrate after the heat treatment to form a silicon thin film on a surface of the support substrate;
   wherein the support substrate is made of plastics;
   the second step of bonding the substrates is carried out by applying silicon oil to the main surface of the silicon substrate and the main surface of the support substrate; and
   the support substrate is held by using a vacuum chuck stage in the fourth step of delaminating.

2. The method for manufacturing a semiconductor substrate according to claim 1, wherein the fourth step is carried out by applying a mechanical shock onto a hydrogen ion implanted region at an edge of the silicon substrate.

* * * * *